United States Patent [19]

Inoue

[11] Patent Number: 4,570,031

[45] Date of Patent: Feb. 11, 1986

[54] HIGH CAPACITANCE LAMINATED BUSS AND METHOD OF MANUFACTURE

[75] Inventor: Kazuo Inoue, Toride, Japan

[73] Assignee: Nippon Mektron Ltd., Japan

[21] Appl. No.: 604,453

[22] Filed: Apr. 27, 1984

[30] Foreign Application Priority Data

Apr. 30, 1983 [JP] Japan .................................. 58-77095

[51] Int. Cl.⁴ .............................................. H01B 7/00
[52] U.S. Cl. .................................... 174/72 B; 29/854; 361/330
[58] Field of Search ......................... 174/72 B; 29/854; 156/47; 361/306, 328, 329, 330, 407

[56] References Cited

U.S. PATENT DOCUMENTS 3,818,119  6/1974  Sutherland et al. ............... 174/72 B
4,381,423  4/1983  Taylor ............................... 174/72 B Primary Examiner—Laramie E. Askin
Attorney, Agent, or Firm—Fishman & Dionne

[57] ABSTRACT

A laminated buss bar comprised of a pair of elongated flat conductors separated by an incorporated dielectric-/electrode structure, the dielectric/electrode structure being sandwiched between the flat conductors on the opposite sides thereof, and a method of manufacture thereof. The buss bar is formed by depositing a flat layer of dielectric material on the inwardly facing surface of a first flat conductor and then forming an electrode of conductive material on the deposited layer of dielectric material. The inwardly facing surface of the first flat conductor also serves as one electrode of a capacitor. Subsequently, the formed conductive material electrode electrically and mechanically contacts the inwardly facing surface of a second flat conductor. Accordingly, the formed conductive material electrode, dielectric material, and one of the pair of elongated flat conductors form a capacitor.

20 Claims, 5 Drawing Figures

HIGH CAPACITANCE LAMINATED BUSS AND METHOD OF MANUFACTURE

BACKGROUND OF THE INVENTION

This invention relates to multilayer or laminated buss bars which include incorporated capacitors or condensers. More particularly, this invention relates to an improved high capacitance laminated buss bar with incorporated capacitors wherein the buss bar has superior temperature and frequency properties and is inexpensive to manufacture as compared to buss bars of the prior art.

With the trend towards large scale piling of integrated circuits in addition to the high density packaging of electronic parts on circuit boards, the power supply buss bars and signal supply buss bars are required to have low inductance and low characteristic impedance and high distributive capacitance in order to avoid the undesirable effects of high frequency noise.

Laminated buss bars in which conductor layers are interleaved and spaced with an insulating film of relatively high dielectric constant are known for use as power supply and signal supply components, these components commonly being referred to as multilayer or laminated buss bars. However, the dielectric materials normally used as the interleaved insulating spacer have limits as to dielectric constant and or distributed capacitance. The use of materials of very high dielectric constant has been proposed, but such materials have limitations, primarily as to cost.

In U.S. Pat. No. 4,266,091, all of the contents of which are incorporated herein by reference, a laminated buss bar is disclosed with incorporated capacitors which result in a significantly improved power or signal distribution system. U.S. Pat. No. 4,266,091 involves the direct incorporation in the buss bar of capacitors which preferably consist of relatively thick ceramic chips, i.e., between about 0.1 to 0.3 millimeters. These relatively thick chips must also have a high dielectric constant. While buss bars constructed in accordance with U.S. Pat. No. 4,266,091 offer significant advantages, limitations exist in that temperature characteristics and frequency characteristics can only be improved by the use of expensive chips. Thus, for reasons of economy, inexpensive chips have had to be generally employed, at a sacrifice of properties such as temperature and frequency. Yet another problem of the buss bars of U.S. Pat. No. 4,266,091 is that the capacitor chips are usually fixed to the conductors by a suitable adhesive. As a result of this need for the application of adhesive, the number of process steps increases and hence the cost of manufacture increases.

SUMMARY OF THE INVENTION

The above discussed and other problems of the prior art are overcome or alleviated by the bus bar of the present invention. In accordance with the present invention, a dielectric layer comprised of a highly dielectric material is provided directly on one surface of a buss conductor. This one surface also serves as one electrode of a capacitor in the structure of the present invention. An electrode is then formed on the dielectric layer; and a second buss conductor is placed over the dielectric/electrode structure, whereby the dielectric/electrode structure is sandwiched between buss conductors on the opposite sides thereof. The novel structure of the buss bar of the present invention provides a high capacitance laminated buss having superior temperature and frequency properties. This novel high capacitance laminated buss bar is also extremely inexpensive to produce relative to prior art buss bars such as that buss bar described in U.S. Pat. No. 4,266,091.

The above discussed and other advantages of the present invention will be apparent to and understood by those skilled in the art by the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

Figure 1:
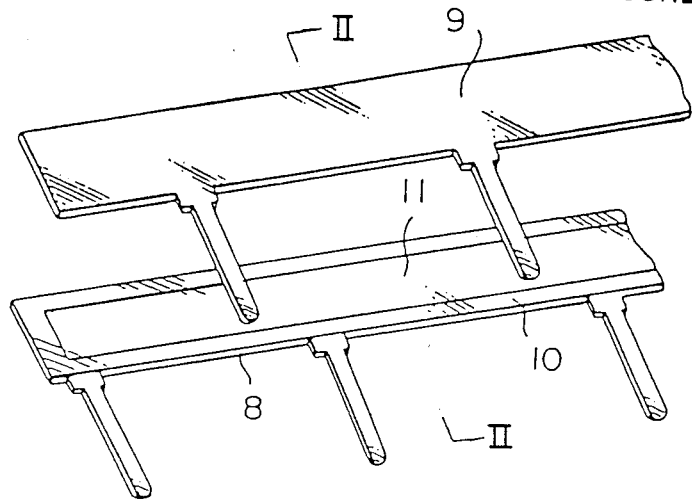
FIG. 1 is an exploded perspective view of a first embodiment of a laminated buss bar in accordance with the present invention.
Figure 2:
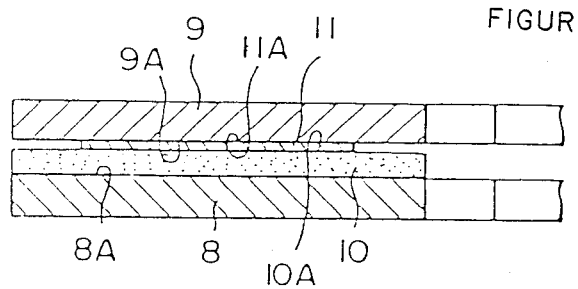
FIG. 2 is an enlarged cross sectional elevation view of a buss bar along the line II—II of FIG. 1.

Referring first to FIGS. 1 and 2, a buss bar in accordance with a first embodiment of the present invention is shown. The buss bar of the present invention generally comprises two conductors 8 and 9 made of any suitable conductive material such as, for example, copper. Inner surface 8A of lower conductor 8 is provided with a dielectric layer 10 consisting of a highly dielectric material such as, for example, a ceramic or the like. Dielectric layer 10 is formed directly on and bonded to conductor surface 8A by any suitable means including sputtering, vapor deposition, melt injection or the like. The thickness of dielectric layer 10 should be between several micrometers and 0.2 millimeters. An electrode 11 comprised primarily of nickel or any other similarly good conductive material is then formed on surface 10A of the dielectric layer 10, also by use of sputtering, vapor deposition or the like. A second buss conductor 9 is then placed in position with surface 11A of electrode 11 in mechanical and electrical contact with surface 9A of conductor 9. Note that conductors 8 and 9 are in a facing spatial relationship. Thus, a resulting structure is obtained wherein a condenser or capacitor, consisting of electrode 11, dielectric 10 and surface 8A, is formed directly between conductors 8 and 9. It will be appreciated that nickel or tin plating or other suitable protective means may be provided on the surface of conductors 8 and 9 as an aid in preventing corrosion.

The laminated buss bar of the present invention having the above discussed structure essentially consists of a highly dielectric material such as a ceramic being deposited on conductor 8 as dielectric layer 10 with a conductive material being deposited on dielectric layer 10 as an electrode 11 by sputtering or a similar method. It should be understood that the thicknesses of the dielectric layer 10 and electrode 11 may be made extremely small so that a selected value of dielectric constant may be obtained. Accordingly, the dielectric layer 10, electrode 11 and surface 8A constitute an internally provided capacitor. Buss conductor 9 may be bonded to electrode 11 by any suitable adhesive; and/or the assembly may be incapsulated in an outer layer of insulation. Consequently, important properties of a condenser or capacitor such as temperature and frequency will be improved relative to prior art buss bars by selection and control of the capacitor materials. Moreover, the material costs involved in producing the above-mentioned buss bar are reduced.

Figure 3:
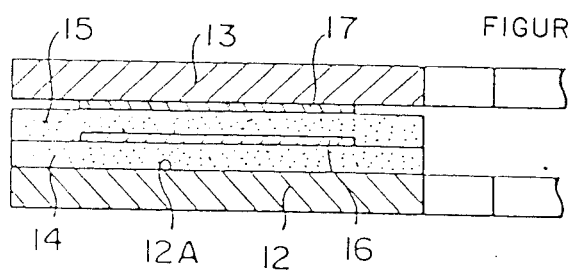
FIG. 3 is a cross sectional elevation view of another embodiment of the buss bar of the present invention.

Referring now to FIG. 3, another embodiment of the buss bar of the present invention is shown. In FIG. 3, the buss bar includes a plurality of capacitors or condensers formed in accordance with the method described above. Thus, dielectric layers 14 and 15 and electrodes 16 and 17 are provided as alternating laminated layers on surface 12A of conductor 12 and between the other conductor 13 in a similar fashion as in FIGS. 1 and 2. Note that uppermost electrode 17 mechanically and electrically contacts upper conductor 13.

The multiple capacitors provided in the buss bar of FIG. 3 may be easily interconnected in either a series or a parallel circuit. For example, during the lamination process of dielectric layers 14 and 15 and electrodes 16 and 17, the layers may be alternated as shown such that the electrodes are connected in series between the conductors 12 and 13. However, if electrode 16 formed between dielectric layers 14 and 15 is connected to either conductor 12 or 13 in a suitable manner, the resulting connection provided between conductors 12 and 13 will be in parallel. Thus, a laminated buss bar in accordance with the present invention having improved temperature and frequency properties and low costs may be provided in either a series or parallel connection depending upon the particular application needed.

Figure 4:
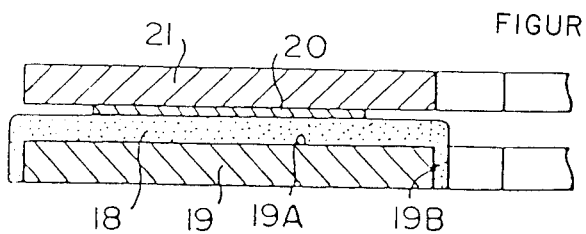
FIG. 4 is a cross sectional elevation view of yet another embodiment of a buss bar in accordance with the present invention.

Referring now to FIG. 4, yet another embodiment of the laminated buss bar of the present invention is shown. In this embodiment, a dielectric layer 18 is formed both on planar surface 19A of conductor 19 and on side surface 19B of the conductor 19 in accordance with the method described above. Subsequently, electrode 20 is formed on the dielectric layer 18 and is electrically and mechanically connected to the oppositely disposed conductor 21. This embodiment may be particularly advantageous in the event that conductors 19 and 21 should slide relative to one another during the lamination procedure. Thus, with the embodiment of FIG. 4, undesirable contact (resulting from relative sliding) between conductors 19 and 21 is prevented by dielectric layer 18. Dielectric layer 18 also prevents changes in the temperature and frequency properties of the buss bar which may occur as a result of the shifting of positions of the conductors even if that shifting does not result in contact of the conductors.

Figure 5:
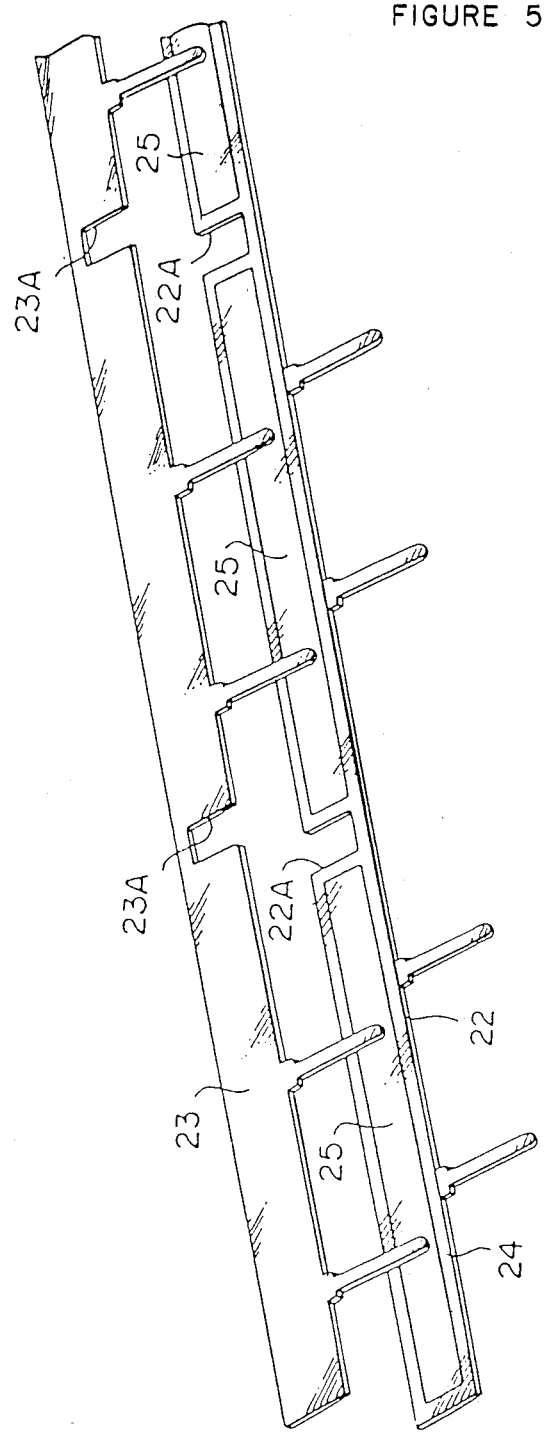
FIG. 5 is an exploded perspective view of still another embodiment of a buss bar in accordance with the present invention.

FIG. 5 shows yet another embodiment of the buss bar of the present invention. In FIG. 5, notches 22A and 23A are provided in selected locations along the two conductors 22 and 23. The notches 22A,23A are oppositely disposed on each respective conductor such that the notches face each other in a center of symmetrical fashion. Condensers or capacitors consisting of dielectric layers 24, electrodes 25 and one of the pair of elongated flat conductors which are similar to those described above are provided between adjacent notches 22A on conductor 22; and the buss conductors 22 and 23 are then laminated together. As a result of this arrangement, it is possible to cut or to sever the laminated buss at notches 22A and 23A after conductors 22 and 23 have been superimposed on each other without affecting the features of the present invention including the improved temperature and frequency properties. The embodiment of FIG. 5 therefore, provides a method of continuously manufacturing the improved buss bar at a low cost.

In accordance with the laminated buss of the present invention, a dielectric layer and an electrode are provided directly on the surface of a first conductor (which also acts as a capacitor electrode) and are sandwiched by an oppositely disposed second conductor. Thus, the electrode electrically and mechanically contacts the second conductor whereby a structure is obtained having a dielectric electrode structure which is incorporated directly between two conductors as part of a unified one piece construction. Consequently, for a given value of required capacitance, a thin dielectric layer will provide a buss bar having satisfactory properties. Moreover, since the adhesion step, which is a necessary step in prior art methods for incorporating capacitor chips, becomes unnecessary, various properties such as temperature and frequency can be improved and manufacturing cost reductions can be realized.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A multi-conductor buss bar assembly comprising:
a first buss conductor, said first buss conductor being formed from an elongated flat strip of conductive material;
a second buss conductor, said second buss conductor being formed from an elongated flat strip of conductive material;
said first and second buss conductors having inwardly facing surfaces;
at least one dielectric/electrode structure incorporated between said buss conductors, said dielectric/electrode structure comprising a flat body of dielectric material in contact with the inwardly facing surface of said first buss conductor, and a conductive electrode on said dielectric material;
the inwardly facing surface of said second buss conductor being electrically connected to said electrode, wherein said first and second buss conductors are spaced apart and electrically insulated from each other by said dielectric/electrode structure;
said first buss conductor including oppositely disposed side surfaces, and wherein;
said flat body of dielectric material includes unitary portions which extend over at least a portion of said side surfaces.

2. The buss bar assembly of claim 1 wherein:
said dielectric material is a ceramic material.

3. The buss bar assembly of claim 1 wherein:
the thickness of said flat body of dielectric material is less than about 0.2 mm.

4. The buss bar assembly of claim 1 wherein:
said conductive electrode is of nickel or primarily nickel alloy.

5. The buss bar assembly of claim 1 including:
corresponding notches at selected areas on said first and second buss conductors; and said dielectric/electrode structure being located between said notches.

6. A multi-conductor buss bar assembly comprising:
a first buss conductor, said first buss conductor being formed from an elongated flat strip of conductive material;
a second buss conductor, said second buss conductor being formed from an elongated flat strip of conductive material;
said first and second buss conductors having inwardly facing surfaces;
a plurality of stacked dielectric/electrode structures incorporated between said buss conductors, said dielectric/electrode structures each comprising;
a flat body of dielectric material with opposed face surfaces; and
a conductive electrode connected to one of said opposed face surfaces;
one of said opposed face surfaces of one of said dielectric material bodies being connected to said inwardly facing surface of said first buss conductor;
one of said electrodes being electrically connected to said inwardly facing surface of said second buss conductor;
said first and second buss conductors being spaced apart and electrically insulated from each other by said stacked dielectric/electrode structures;
said first buss conductor including oppositely disposed side surfaces, and wherein;
one of said flat bodies of dielectric material from one of said stacked dielectric/electrode structures includes unitary portions which extend over at least a portion of said side surfaces.

7. The buss bar assembly of claim 6 wherein:
said dielectric material is a ceramic material.

8. The buss bar assembly of claim 6 wherein:
the thickness of each flat body of dielectric material is less than about 0.2 mm.

9. The buss bar assembly of claim 6 wherein:
at least one of said conductive electrodes from said stacked dielectric/electrode structures is of nickel or primarily nickel alloy.

10. The buss bar assembly of claim 6 including:
corresponding notches at selected areas on said first and second buss conductors; and
said stacked dielectric/electrode structures being located between said notches.

11. A method of manufacturing a multi-conductor buss bar assembly including the steps of:
forming a first buss conductor from an elongated flat strip of conductive material, said first buss conductor having an inwardly facing surface and having oppositely disposed side surfaces;
depositing at least one flat layer of a dielectric material on the inwardly facing surface of said first buss conductor;
depositing said dielectric material on at least a portion of said side surfaces whereby said one flat layer of dielectric material includes unitary portions which extend over said side surfaces of said first buss conductor;
forming an electrode of conductive material on said layer of dielectric material;
forming a second buss conductor from an elongated flat strip of conductive material, said second buss conductor having an inwardly facing surface; and spacing apart and electrically insulating said first and second buss conductors from each other by said layer of dielectric material; and
electrically connecting said formed conductive electrode to said inwardly facing surface of said second buss conductor.

12. The method of claim 11 wherein:
said dielectric material is deposited on said inwardly facing surface and said side surfaces of said first buss conductor by at least one of the methods selected from the group consisting of sputtering, vapor deposition and melt injection.

13. The method of claim 11 wherein:
said electrode is formed by at least one of the methods selected from the group consisting of sputtering and vapor deposition.

14. The method of claim 11 wherein:
the thickness of said dielectric layer is less than about 0.2 mm.

15. The method of claim 11 wherein:
said conductive electrode is of nickel or primarily nickel alloy.

16. The method of claim 11 including:
forming corresponding notches at selected areas on said first and second buss conductors; and
providing said dielectric material on said inwardly facing surface and said side surfaces of said first buss conductor and said electrode between said notches.

17. A method of manufacturing a multi-conductor buss bar assembly including the steps of:
forming a first buss conductor from an elongated flat strip of conductive material, said first buss conductor having an inwardly facing surface and having oppositely disposed side surfaces;
depositing a first flat layer of a dielectric material on the inwardly facing surface of said first buss conductor;
depositing said dielectric material on at least a portion of said side surfaces whereby said first flat layer of dielectric material includes unitary portions which extend over said side surfaces;
depositing at least another layer of said dielectric material on said first flat layer of dielectric material;
forming an electrode of conductive material between each layer of dielectric material; and
forming a second buss conductor from an elongated flat strip of conductive material, said second buss conductor having an inwardly facing surface;
spacing apart and electrically insulating said first and second buss conductors from each other by said layers of dielectric material; and
electrically connecting one of said formed conductive electrodes to said inwardly facing surface of said second buss conductor.

18. The method of claim 17 including:
connecting said electrodes in series between said first and second buss conductors.

19. The method of claim 17 including:
connecting said electrodes in parallel between said first and second buss conductors.

20. A multi-layer conductor buss bar assembly formed by a method of manufacturing including the steps of:
forming a first buss conductor from an elongated flat strip of conductive material, said first buss conductor having an inwardly facing surface and having oppositely disposed side surfaces;

depositing at least one flat layer of a dielectric material on the inwardly facing surface of said first buss conductor;

depositing said dielectric material on at least a portion of said side surfaces whereby said one flat layer of dielectric material includes unitary portions which extend over said side surfaces of said first buss conductor;

forming an electrode of conductive material on said layer of dielectric material;

forming a second buss conductor from an elongated flat strip of conductive material, said second buss conductor having an inwardly facing surface; and spacing apart and electrically insulating said first and second buss conductors from each other by said layer of dielectric material; and electrically connecting said formed conductive electrode to said inwardly facing surface of said second buss conductor.

* * * * *